US006601770B1

(12) United States Patent
Ikefuji et al.

(10) Patent No.: US 6,601,770 B1
(45) Date of Patent: Aug. 5, 2003

(54) RESPONSE DEVICE IN CONTACT/CONTACTLESS IC CARD COMMUNICATION SYSTEM

(75) Inventors: Yoshihiro Ikefuji, Kyoto (JP); Hiroharu Okada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/367,845

(22) PCT Filed: May 15, 1998

(86) PCT No.: PCT/JP98/02154

§ 371 (c)(1),
(2), (4) Date: Aug. 26, 1999

(87) PCT Pub. No.: WO98/53423

PCT Pub. Date: Nov. 26, 1998

(30) Foreign Application Priority Data

May 19, 1997  (JP) .............................. 9/128295

(51) Int. Cl.⁷ .............................................. G06K 19/06
(52) U.S. Cl. ....................... 235/492; 235/486; 235/476; 235/441
(58) Field of Search ................................. 235/440, 441, 235/451, 476, 486, 492

(56) References Cited

U.S. PATENT DOCUMENTS

| 4,994,659 A | * | 2/1991 | Yabe et al. ............... 235/492 |
| 5,018,051 A | | 5/1991 | Yamada et al. .......... 361/393 |
| 5,049,728 A | | 9/1991 | Rovin ........................ 235/492 |
| 5,206,495 A | * | 4/1993 | Kreft ......................... 235/492 |
| 5,241,160 A | * | 8/1993 | Bashan et al. ............ 235/492 |
| 5,321,240 A | * | 6/1994 | Takahira ................... 235/492 |
| 5,444,222 A | * | 8/1995 | Inoue ........................ 235/492 |
| 5,554,821 A | * | 9/1996 | Patterson et al. ......... 174/52.2 |
| 5,563,772 A | * | 10/1996 | Nichols .................... 174/17 R |
| 5,568,364 A | * | 10/1996 | Madden .................... 174/17 R |
| 5,585,617 A | * | 12/1996 | Ohbuchi et al. .......... 235/492 |
| 5,598,032 A | | 1/1997 | Fidalgo ..................... 235/492 |
| 5,617,297 A | * | 4/1997 | Lo et al. ................... 174/52.2 |
| 5,671,525 A | | 9/1997 | Fidalgo ..................... 235/492 |
| 5,698,838 A | | 12/1997 | Yamaguchi ............... 235/492 |
| 5,705,852 A | * | 1/1998 | Orihara et al. ............ 257/679 |
| 5,710,421 A | * | 1/1998 | Kokubu .................... 235/492 |
| 5,723,904 A | * | 3/1998 | Shiga ........................ 257/698 |
| 5,773,880 A | * | 6/1998 | Ohno ........................ 235/380 |
| 5,801,372 A | * | 9/1998 | Yamaguchi ............... 235/492 |
| 5,852,289 A | * | 12/1998 | Masahiko ................. 235/492 |
| 5,854,481 A | * | 12/1998 | Ricotti et al. ............. 235/380 |
| 5,856,622 A | * | 1/1999 | Kohama .................... 235/492 |
| 6,045,043 A | * | 4/2000 | Bashan et al. ............ 235/492 |
| 6,079,622 A | * | 6/2000 | Goto ......................... 235/492 |
| 6,097,349 A | * | 8/2000 | Sanford .................... 333/26 |
| 6,223,990 B1 | * | 5/2001 | Kamei ...................... 235/492 |
| 6,254,006 B1 | * | 7/2001 | Mish ......................... 235/492 |

FOREIGN PATENT DOCUMENTS

| DE | 44 38 287 C1 | | 10/1994 |
| EP | 0339763 A2 | * | 11/1989 |
| JP | 63106886 A | * | 5/1988 |
| JP | 522164 A | * | 1/1993 |
| JP | 6164432 A | * | 6/1994 |
| JP | 7-239922 | | 9/1995 |
| JP | 8-30749 | | 2/1996 |
| JP | 8-52968 | | 2/1996 |
| JP | 8202844 A | * | 8/1996 |
| JP | 9-62816 | | 3/1997 |
| JP | 10-124626 | | 5/1998 |
| WO | WO 93/23908 | | 11/1993 |
| WO | WO 95/35609 | | 12/1995 |
| WO | WO 96/13804 | | 5/1996 |

* cited by examiner

Primary Examiner—Michael G. Lee
Assistant Examiner—Uyen-Chau Le
(74) Attorney, Agent, or Firm—Arent Fox Kintner Plotkin & Kahn PLLC

(57) ABSTRACT

An IC card (80) has a communication module (20) embedded in a core member (30). The communication module (20) has a contact terminal (24), an antenna (60) and an IC chip (82) mounted on the same circuit board (22) for making the assembly work easier. The contact terminal (24) is formed at an upper surface of the circuit board (22) to be exposed from an opening (26*a*) of a surface material (26). The antenna (60) and the IC chip (82) are provided to a lower surface of the circuit board (22) to indirectly face the contact terminal (24). The IC chip (82) automatically adjusts the resonance frequency of the antenna (60) such that an output from the antenna (60) has the maximum value constantly.

25 Claims, 19 Drawing Sheets

FIG.16

| J | C | B | A | FAVORABLE FLAG |
|---|---|---|---|---|
| 1 | 0 | 0 | 0 | 0 |
| 2 | 1 | 0 | 0 | 0 |
| 3 | 1 | 1 | 0 | 0 |
| 4 | 1 | 1 | 1 | 0 |
| 5 | 1 | 1 | 1 | 1 |
| 6 | 1 | 1 | 1 | 0 |
| 7 | 1 | 1 | 0 | 0 |
| ⋮ | ⋮ | ⋮ | ⋮ | ⋮ |
| N | 0 | 0 | 0 | 0 |

RESPONSE DEVICE IN CONTACT/CONTACTLESS IC CARD COMMUNICATION SYSTEM

TECHNICAL FIELD

The present invention relates to a responser in an IC card communication system and a communication module used for it, and particularly to a responser or the like used for both of contact and non-contact applications.

BACKGROUND ART

A communication system employing the IC card is applied to prepaid cards, lifts of the ski resorts, automatic ticket inspection at the railroad gates, automatic goods sorting and the like. Examples of the IC card are, a contact type IC card having a contact terminal connected to an IC embedded in a card through which power supply and data interchange are carried out, a non-contact type IC card using electromagnetic waves for power supply and data interchange, and a single IC card combining both of the contact and non-contact applications.

An example of a conventional IC card 2 used for both of the contact and non-contact applications (one coil type) is illustrated in FIG. 20. A circuit board 4 is placed within IC card 2 shown in FIG. 20. An IC chip 8 is placed at the lower surface of circuit board 4, and a metallic contact terminal 6 is formed at the upper surface of circuit board 4. IC chip 8 is electrically connected to contact terminal 6. Contact terminal 6 is formed to be exposed at the surface of IC card 2. IC card 2 receives power from and communicates data with a contact type reader/writer (interrogator (not shown)) through contact terminal 6. A control circuit (not shown) provided in IC chip 8 decodes data to rewrite data in a nonvolatile memory (not shown) provided in IC chip 8 and responds to the contact type reader/writer.

An antenna 10 is also placed in IC card 2. Antenna 10 is electrically connected to IC chip 8 via a wire 12. IC card 2 receives, at a resonance circuit (not shown) including antenna 10, electromagnetic waves transmitted from a non-contact type reader/writer (not shown) for using them as power source. IC card 2 also receives data multiplexed on the electromagnetic waves and transmitted. Response is made by changing the impedance of the resonance circuit. The non-contact type reader/writer finds the content of the response by detecting impedance change (impedance reflection) of its resonance circuit (not shown) caused by impedance change of the resonance circuit of IC card 2.

It is therefore advantageous to employ IC card 2 used for both of the contact and non-contact applications since communication is possible whether the reader/writer is the contact type or the non-contact type.

However, following problems arise in such a conventional IC card 2 which is used for both of the contact and non-contact applications as described above. For the conventional IC card 2, circuit board 4 provided with contact terminal 6 and IC chip 8 as well as antenna 10 should be prepared separately, and these should be electrically connected by wire 12. As a result, the manufacturing process of IC card 2 becomes complicated to cause increase in the manufacturing cost of IC card 2. In addition, a malfunction is likely to occur due to disconnection of wire 12 resulting from deformation of IC card 2, leading to relatively low reliability of the IC card.

An object of the present invention is to solve such problems of the conventional IC card used for both of the contact and non-contact applications, and provide a responser with low cost and high reliability as well as a communication module used for it.

DISCLOSURE OF THE INVENTION

According to the present invention, a responser capable of communicating with an interrogator is provided with a communication module. The communication module includes a circuit board, a contact terminal, an antenna, and a processing circuit. The contact terminal is provided to the circuit board and in electrical contact with the interrogator. The antenna is provided to the circuit board and receives electromagnetic waves from the interrogator. The processing circuit is provided to the circuit board and connected to the contact terminal and the antenna to process a signal supplied from the interrogator via the contact terminal or the antenna and a signal to be supplied to the interrogator via the contact terminal or the antenna.

In such a communication module, the contact terminal, the antenna, and the processing circuit are provided to the same circuit board, so that the communication module is assembled in a box container highly easily. Consequently, reduction of occurrence of defective products in the assembly work as well as reduction in the assembly cost are possible. Further, since a wire for connecting the antenna to the circuit board is unnecessary, a defect such as the wire disconnection does not happen even if a strong force is applied to the responser. In addition, since the antenna is provided to the circuit board, the circuit board is resistant to bending, twisting and the like.

Preferably, the contact terminal is provided to one surface of the circuit board, and the antenna and the processing circuit are provided to the other surface of the circuit board. Accordingly, the communication module is made more compact.

Preferably, the antenna is directly formed on the circuit board. The antenna can thus be formed easily on the circuit board using the general etching technique.

Preferably, the processing circuit includes a switching unit and a setting unit. The switching unit switches resonance frequency of the antenna. The setting unit sets a switching manner of the switching unit to obtain a desired level of an output from the antenna. Accordingly, the resonance frequency can be adjusted automatically regardless of the material, shape or size of the contact terminal, or the positional relation and distance between the contact terminal and the antenna, or the like.

BRIEF DESCRIPTION OF THE DRAWINGS

FIG. 16 illustrates the contents stored in a nonvolatile memory in the automatic adjust processing shown in FIG. 13.

BEST MODES FOR CARRYING OUT THE INVENTION

Figure 1:
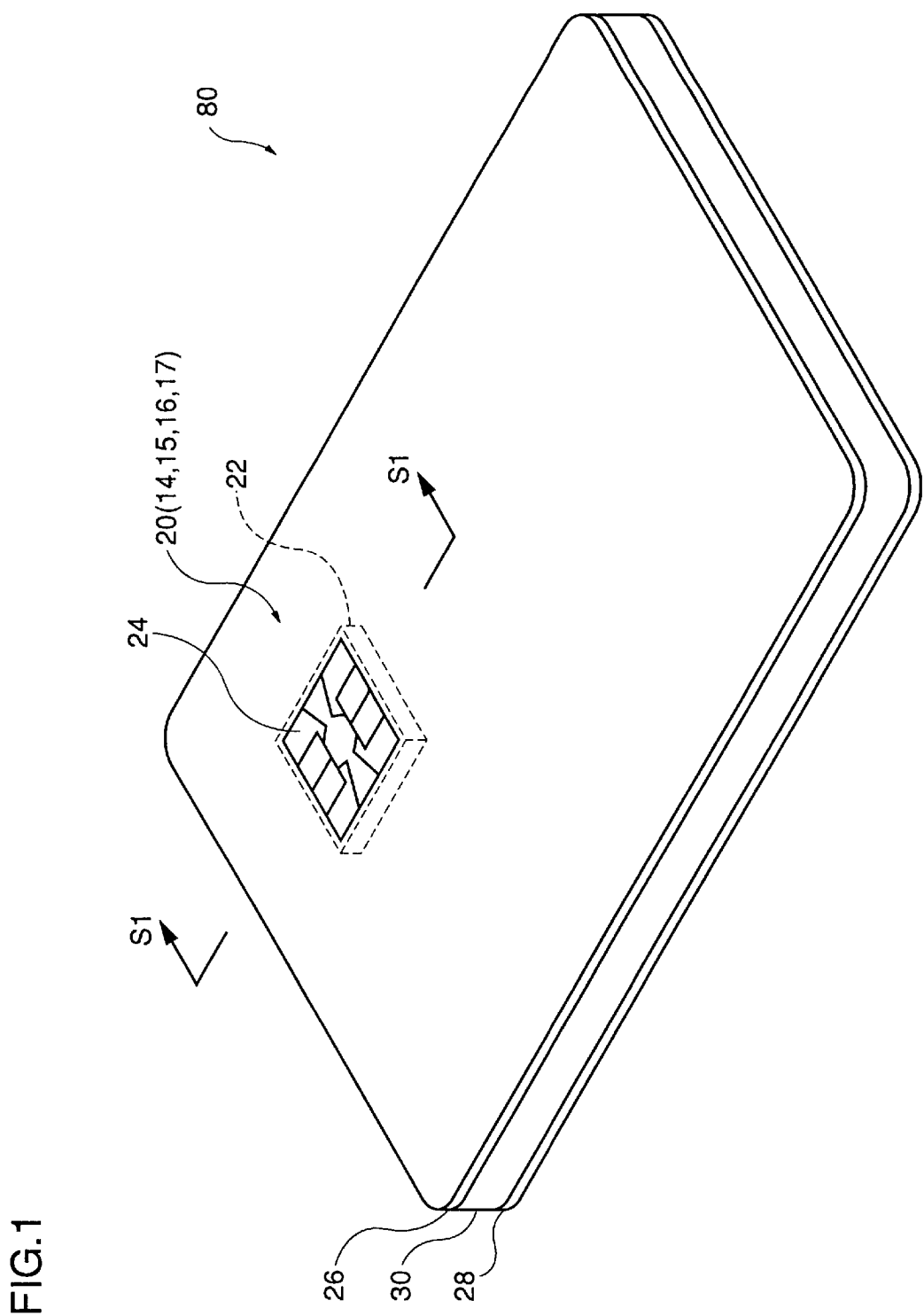
FIG. 1 is a perspective view illustrating an entire structure of an IC card according to an embodiment of the invention.

FIG. 1 illustrates an entire structure of an IC card 80 which is a responser according to one embodiment of the invention. IC card 80 is an IC card (one coil type) used for both of the contact and non-contact applications and applicable to prepaid cards, lifts of the ski resorts, automatic ticket inspection at railroad gates, automatic goods sorting and the like. IC card 80 includes, as shown in FIG. 1, a communication module 20 for enabling communication with an interrogator (not shown).

Figure 2:
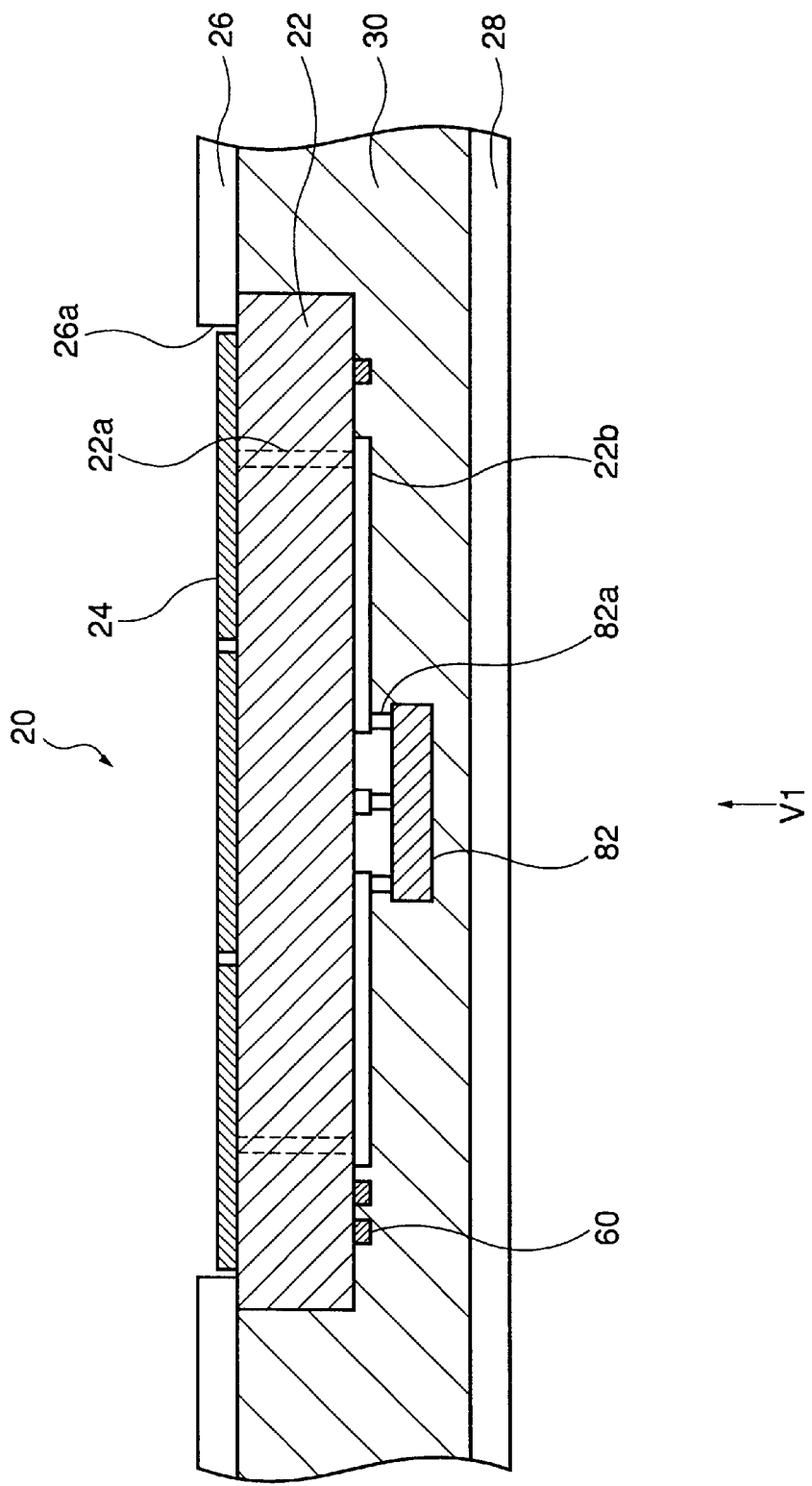
FIG. 2 is a cross sectional view illustrating a main portion of the IC card along line S1—S1 shown in FIG. 1.

FIG. 2 is a cross sectional view of a main portion of IC card 80 along line S1—S1 shown in FIG. 1. As shown in FIGS. 1 and 2, IC card 80 has a structure where a surface material 28, a core member 30, and a surface material 26 are deposited one after another. Surface material 28, core member 30 and surface material 26 function as a box-shaped body for supporting communication module 20. As surface materials 28 and 26, synthetic resin such as vinyl chloride, PET (polyethylene terephthalate) or the like is employed. Core member 30 is formed of synthetic resin.

Communication module 20 is embedded in core member 30. Communication module 20 includes a circuit board 22, a plurality of contact terminals 24 formed at the upper surface of circuit board 22, an antenna 60 formed at the lower surface of circuit board 22, and an IC chip 82 attached to the lower surface of circuit board 22. Contact terminals 24 are provided for electrical contact with the interrogator. Antenna 60 is provided for receiving electromagnetic waves from the interrogator. IC chip 82 contains a processing circuit which is described below. The processing circuit processes a signal supplied from the interrogator via contact terminals 24 or antenna 60, and a signal to be supplied to the interrogator via contact terminals 24 or antenna 60. Antenna 60 and IC chip 82 are placed opposite to contact terminals 24.

Various materials are available for circuit board 22 and, for example, a material formed of glass epoxy is used. A printed interconnection line 22b is formed at the lower surface of circuit board 22.

Figure 3:
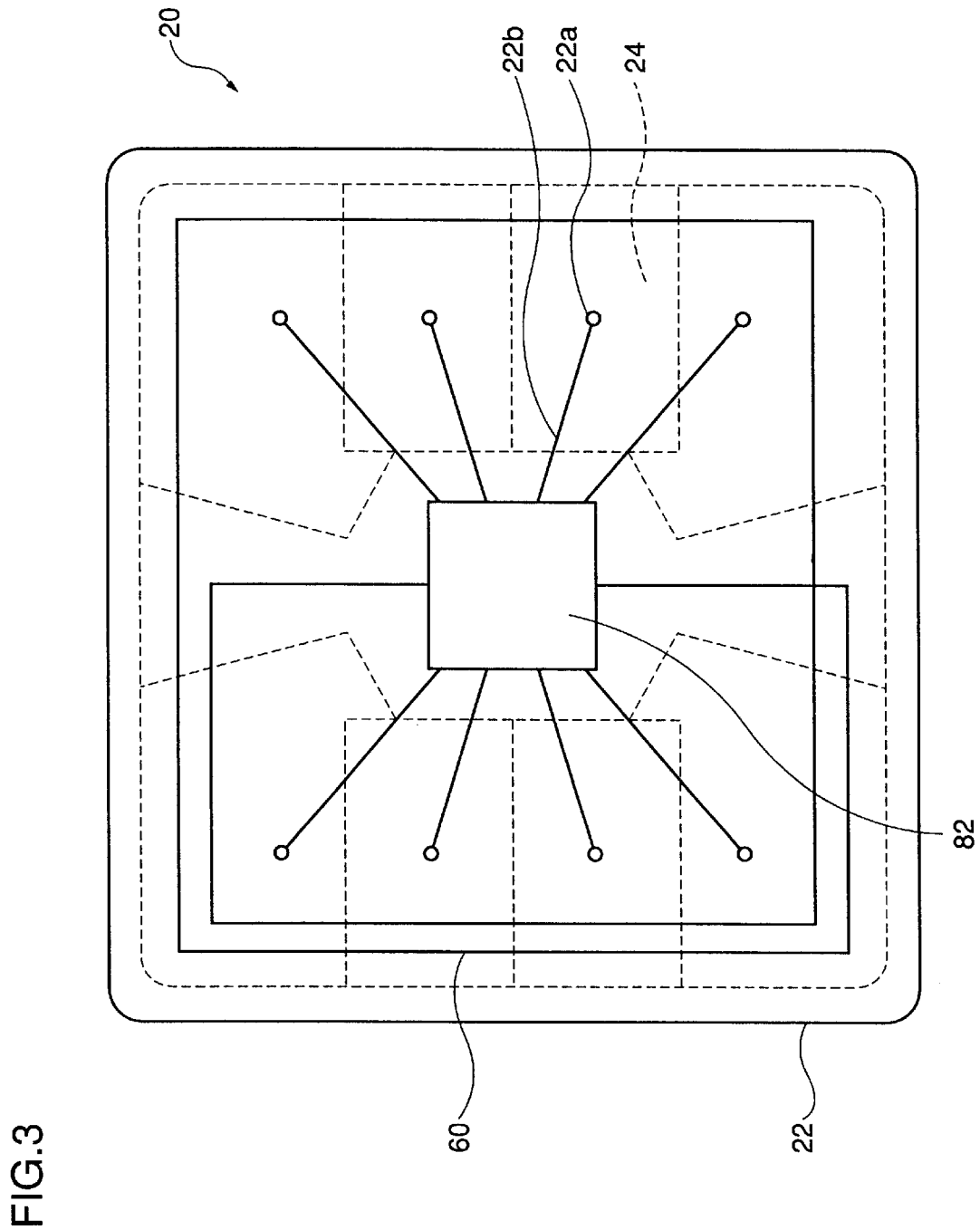
FIG. 3 is a bottom view illustrating a communication module from point V1 shown in FIG. 2.

FIG. 3 is a bottom view of communication module 20 from point V1 shown in FIG. 2. A plurality of (8, for example) contact terminals 24 adjacent to each other are placed at the upper surface of circuit board 22. Contact terminals 24 are insulated from each other. Various materials are available for contact terminals 24 and, for example, a material formed by laying copper (Cu), nickel (Ni) and hardened gold (Au+Co) on each other on circuit board 22 is employed. The surfaces of contact terminals 24 are formed to be exposed from an opening 26a provided to surface material 26.

A terminal 82a is provided to IC chip 82, and IC chip 82 is attached to the lower surface of circuit board 22 by connecting terminal 82a and printed interconnection line 22b. Various ways are available for If connecting terminal 82a and printed interconnection line 22b and, for example, soldering, bumping technique utilizing eutectic crystal bonding of gold (Au) and tin (Sn), or the like is employed.

Antenna 60 is directly formed at the lower surface of circuit board 22 by etching, printing or the like. Antenna 60 can alternatively be formed by attaching a metal line to the lower surface of circuit board 22 with adhesive.

As described below (see FIG. 10), the processing circuit in IC chip 82 includes a capacitor which constitutes, together with antenna 60, a resonance circuit 40, a processing unit 90, and the like. Each of contact terminals 24 is connected to processing unit 90 placed in IC chip 82 via a through hole 22a, printed interconnection line 22b and terminal 82a provided to circuit board 22. Antenna 60 is connected to the capacitor and processing unit 90 provided in IC chip 82 via terminal 82a.

If one communication module 20 carrying contact terminals 24, antenna 60 and IC chip 82 on the same circuit board 22 is prepared as described above, IC card 80 can be completed by just embedding it in core member 30 to be sandwiched between surface materials 28 and 26. Accordingly, assemble work of IC card 80 becomes significantly easy. As a result, reduction of occurrence of defective products in the assembly work as well as reduction in the assembly cost are possible. Further, a wire for connecting antenna 60 and circuit board 22 is not required since antenna 60 is formed on circuit board 22. Therefore, malfunction due to wire disconnection resulting from deformation of IC card 80 or the like does not happen. In other words, a low-cost and high-reliability IC card used for both of the contact and non-contact applications is implemented.

Figure 4:
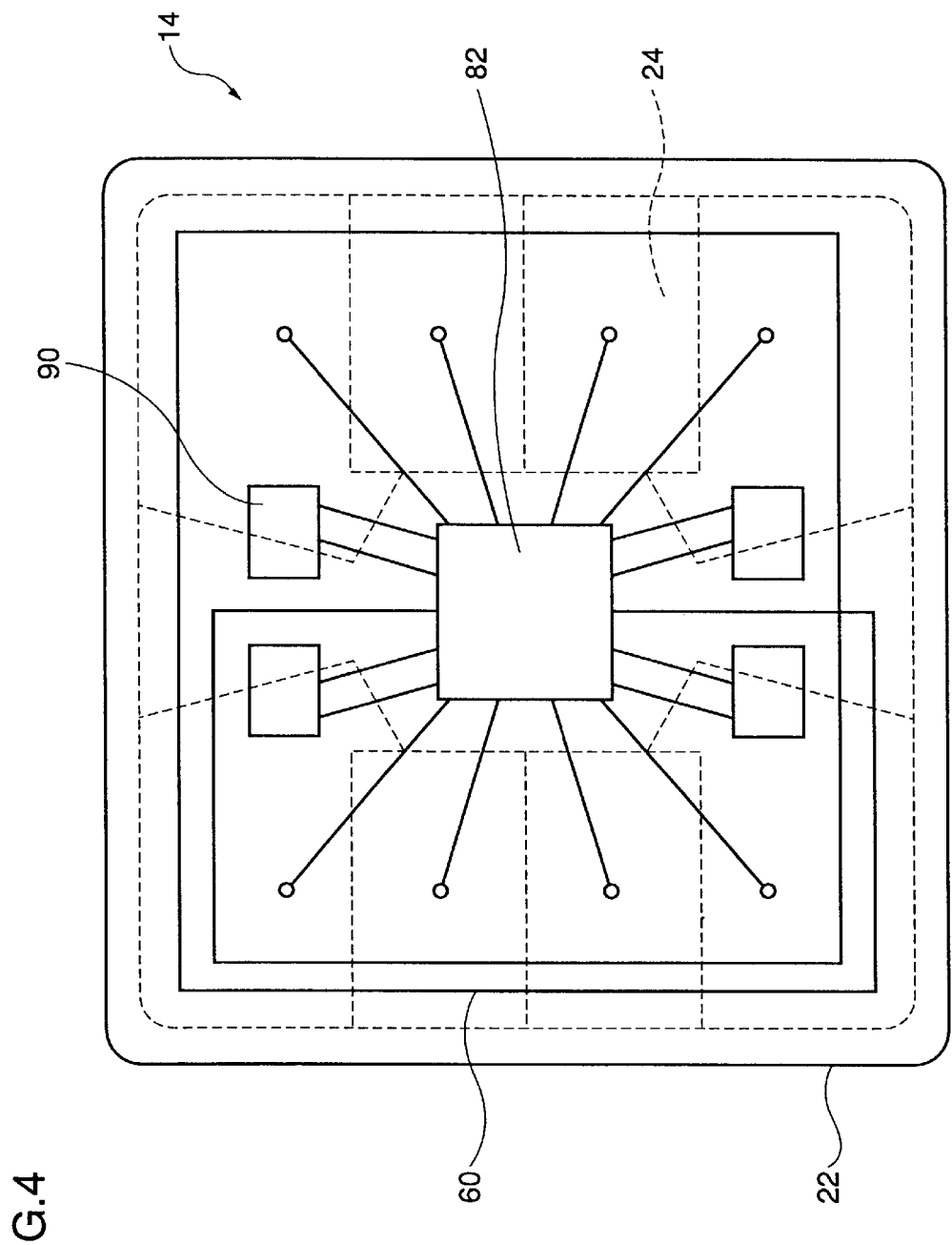
FIG. 4 is a bottom view illustrating a communication module in another embodiment of the invention.

FIG. 4 is a bottom view of a communication module 14 according to another embodiment of the invention. Communication module 20 (see FIG. 3) described above is structured such that the capacitor constituting resonance circuit 40 together with antenna 60 is placed in IC chip 82, while communication module 14 in this embodiment is structured such that a capacitor 90 constituting a resonance circuit 40 together with an antenna 60 is directly carried by a circuit board 22, without placed in an IC chip 82. Such a structure allows the capacitance of capacitor 90 to be changed easily, and is therefore advantageous for changing the resonance frequency of resonance circuit 40.

Figure 5:
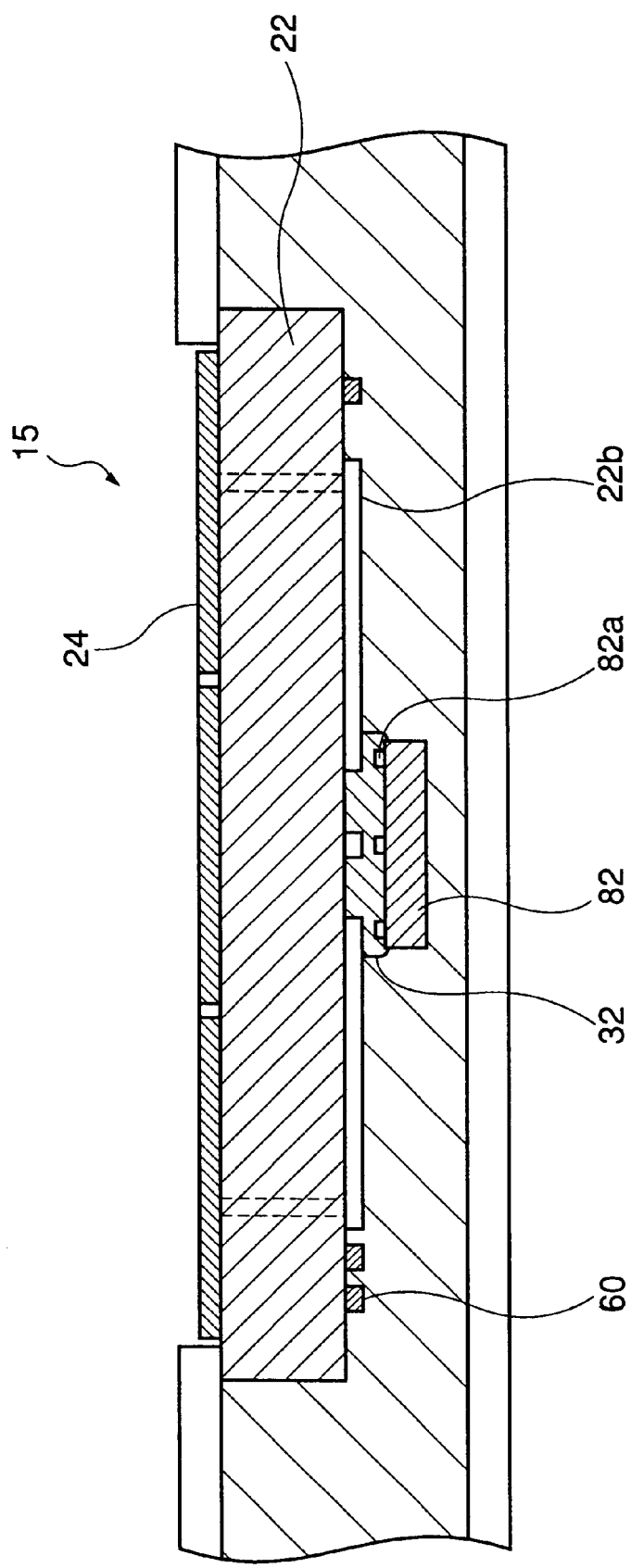
FIGS. 5–7 are cross sectional views respectively illustrating main portions of communication modules in other embodiments of the invention.

FIG. 5 is a cross sectional view illustrating a main portion of a communication module 15 according to still another embodiment of the invention. Communication module 20 (see FIG. 2) described above is structured such that terminal 82a and printed interconnection line 22b are directly connected by such a method as soldering, or bumping technique using the eutectic crystal bonding for connecting circuit board 22 and IC chip 82, while communication module 15 of this embodiment is structured such that a terminal 82a and a printed interconnection line 22b are connected via an anisotropic conductor 32.

Anisotropic conductor 32 is a conductor having conductivity in one direction only and having an adhesive property. Anisotropic conductor 32 is used for bonding IC chip 82 and circuit board 22 to electrically connect terminal 82a and printed interconnection line 22b placed opposite to each other.

Anisolm (Hitachi Chemical Co., Ltd.) which is thermosetting adhesive, for example, can be used as the anisotropic conductor. Firm bonding of IC chip 82 and circuit board 22 is possible by using such an anisotropic conductor 32. Further, by using anisotropic conductor 32, moisture can be prevented from intruding into IC chip 82 to some degree.

Figure 6:
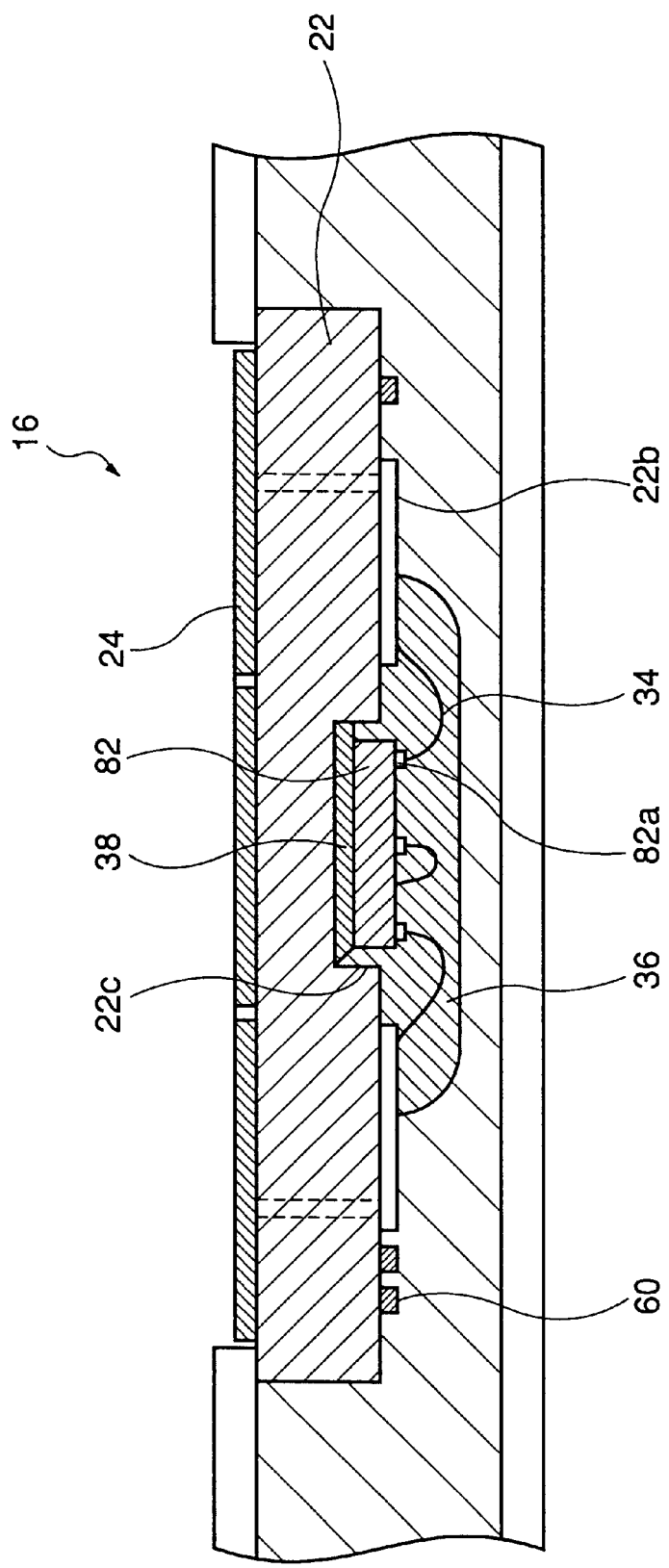

FIG. 6 is a cross sectional view illustrating a main portion of a communication module 16 according to still another embodiment of the invention. Communication module 16 of this embodiment is structured such that a wire 34 is used for connecting a terminal 82a to a printed interconnection line 22b and to an antenna 60, while each communication module described above is structured such that terminal 82a of IC chip 82 is connected directly or indirectly via anisotropic conductor 32 to printed interconnection line 22b and antenna 60 on circuit board 22.

An IC chip 82 is fixed to a cavity 22c provided to the lower part of a circuit board 22 using an adhesive 38. Using wire 34, terminal 82a is connected to printed interconnection line 22b and antenna 60, and thereafter this joint is covered with a sealing resin 36.

Such a structure makes it possible to form a communication module by using the general wire bonding technique. Further, by employing sealing resin 36, the joint can be made waterproof and disconnection accident of wire 34 can be prevented to some degree.

Although antenna 60 is provided to the lower surface of circuit board 22 in respective embodiments described above, antenna 60 can be placed at the upper surface of circuit board 22, that is, at the same surface as contact terminals 24. In this case, circuit board 22 may be formed to be slightly larger than contact terminals 24, to surround contact terminals 24 by antenna 60.

Figure 7:
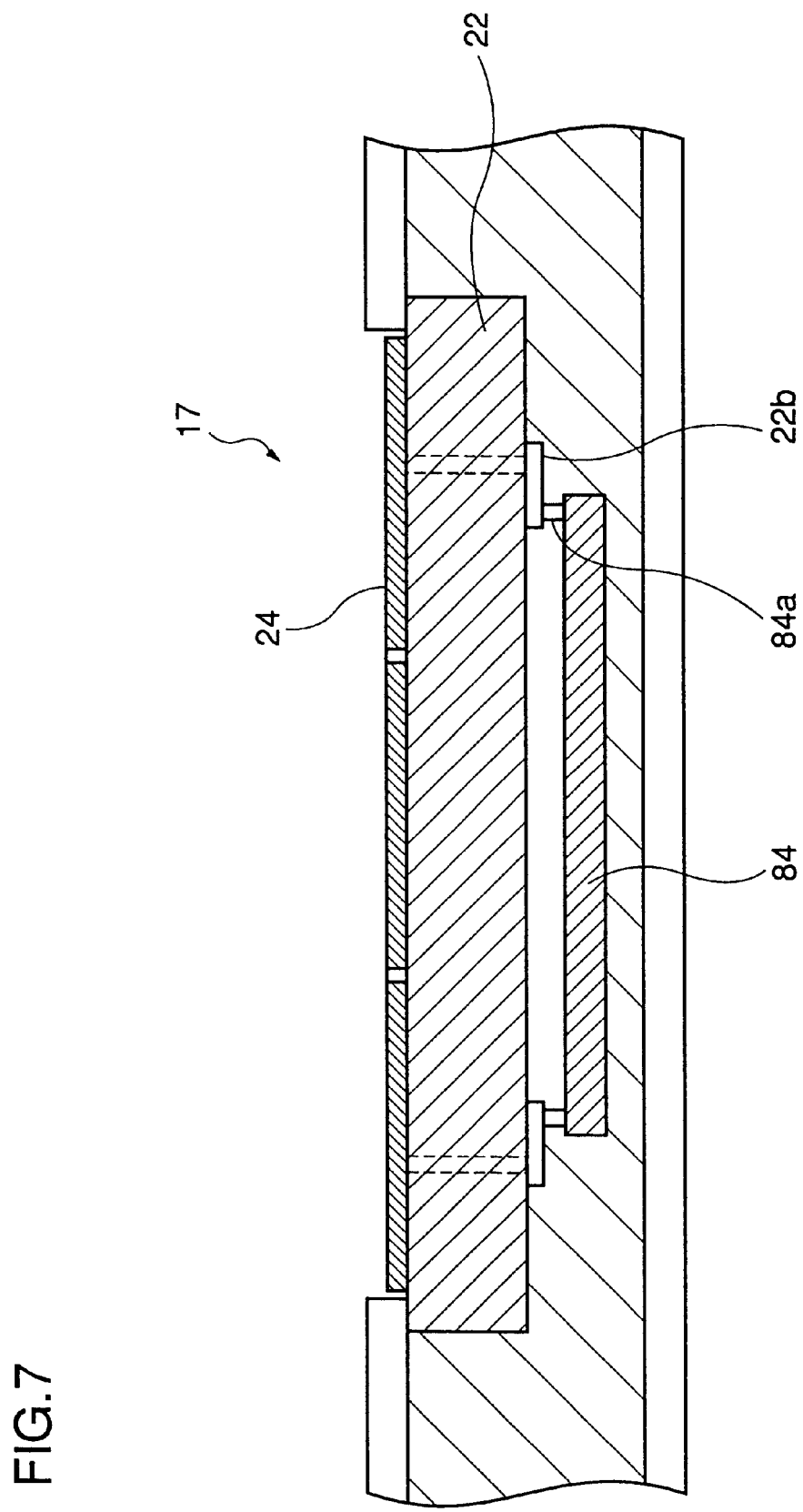

FIG. 7 is a cross sectional view illustrating a main portion of a communication module 17 according to still another embodiment of the invention. Communication module 17 in this embodiment has an antenna (not shown) placed within an IC chip 84, while each communication module described above is structured to have antenna 60 placed at circuit board 22. Specifically, the antenna is formed by utilizing an aluminum interconnection layer (not shown) within IC chip 84.

A printed interconnection line 22b on a circuit board 22 and a terminal 84a of IC chip 84 are connected by soldering, bumping technique utilizing the eutectic crystal bonding, or the like. It is noted that the method of connecting printed interconnection line 22b and terminal 84a of IC chip 84 is not limited to this, and above-described anisotropic conductor 32 or wire 34 may be used.

The antenna constituting a resonance circuit 40 together with a capacitor can substantially be integrated with processing unit 90 (see FIG. 10) by forming the antenna using the aluminum interconnection layer or the like in IC chip 84. Accordingly, assembly work of the communication module becomes easier. Reduction of occurrence of defective products in the assembly work as well as reduction in the assembly cost is thus possible.

Figure 8:
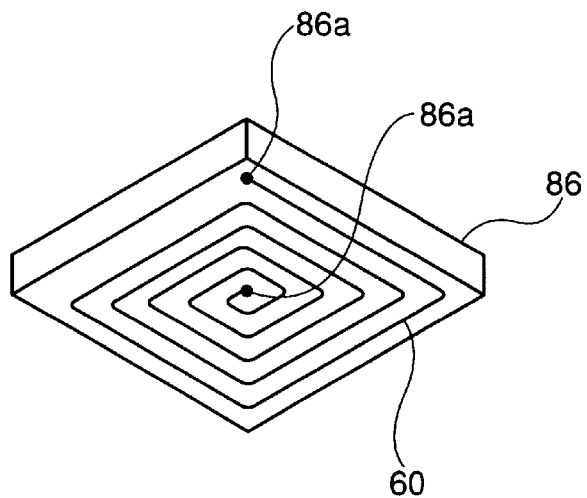
FIG. 8 is a perspective view illustrating an IC chip used in a communication module in still another embodiment of the invention.

FIG. 8 illustrates an IC chip 86 used for a communication module according to still another embodiment of the invention. For IC chip 86 of this embodiment, an antenna 60 is formed at the lower surface of IC chip 86 by etching, printing or the like while communication module 17 (see FIG. 7) described above is structured to utilize the aluminum interconnection layer in IC chip 84 for generating the antenna. Antenna 60 is connected to a capacitor (not shown) and processing unit 90 (see FIG. 10) placed within IC chip 86 via a terminal 86a provided to the lower surface of IC chip 86.

Antenna 60 constituting a resonance circuit 40 together with the capacitor can substantially be integrated with processing unit (see FIG. 10), by forming antenna 60 at the surface of IC chip 86. The assembly work of the communication module thus becomes easier. Accordingly, reduction of occurrence of defective products in the assembly work as well as reduction in the assembly cost are possible. Further, such a structure allows the inductance of antenna 60 to be changed after manufacturing of IC chip 86 and is accordingly advantageous. Although antenna 60 is formed at the lower surface of IC chip 86 in this embodiment, antenna 60 may be formed at the upper surface of IC chip 86.

Figure 9:
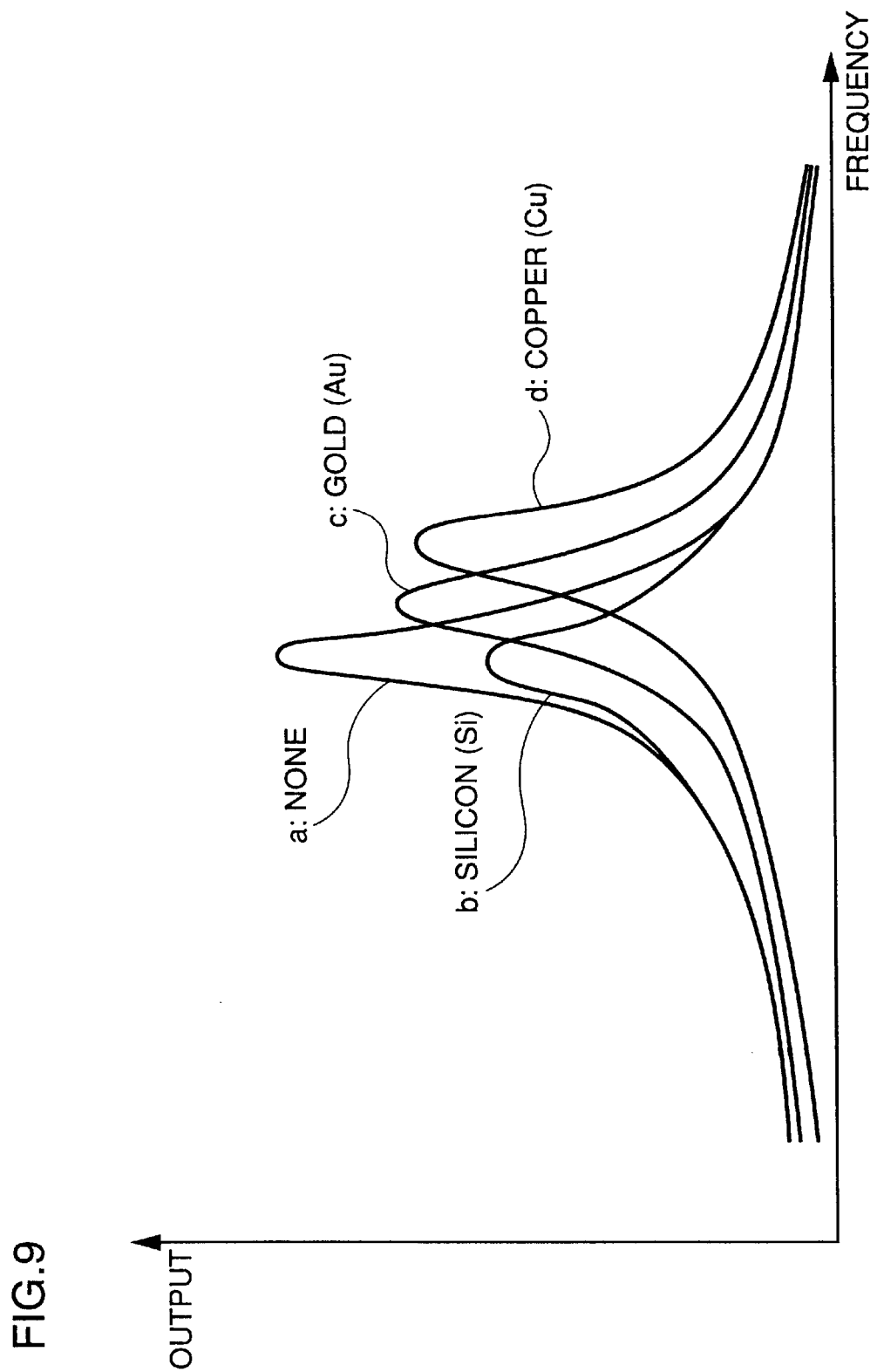
FIG. 9 illustrates frequency characteristics of a resonance circuit exhibited when various metals or the like are placed in the vicinity of an antenna.

FIG. 9 shows frequency characteristics of resonance circuit 40 (see FIG. 10) exhibited when various metals are placed in the vicinity of antenna 60. In FIG. 9, the axis of abscissas represents the frequency and the axis of ordinates represents the output. It can be seen that the frequencies that cause high output of antenna 60 are different depending on the cases in which (a) none, (b) silicon, (c) gold, and (d) copper are placed respectively in the vicinity of antenna 60.

In this embodiment, the influence of contact terminal 24 is considerable since antenna 60 and contact terminal 24 are formed on the same substrate 22, so that a relatively large capacitive or inductive reactance occurs at antenna 60. Therefore, the difference in material, shape, size of contact terminal 24 placed in the vicinity of antenna 60, the positional relation and distance between contact terminal 24 and antenna 60 cause the output from antenna 60 to vary, possibly leading to change in the resonance frequency of resonance circuit 40. IC card 80 shown in FIG. 1 has a function for automatically adjusting the resonance frequency even if the resonance frequency changes.

Figure 10:
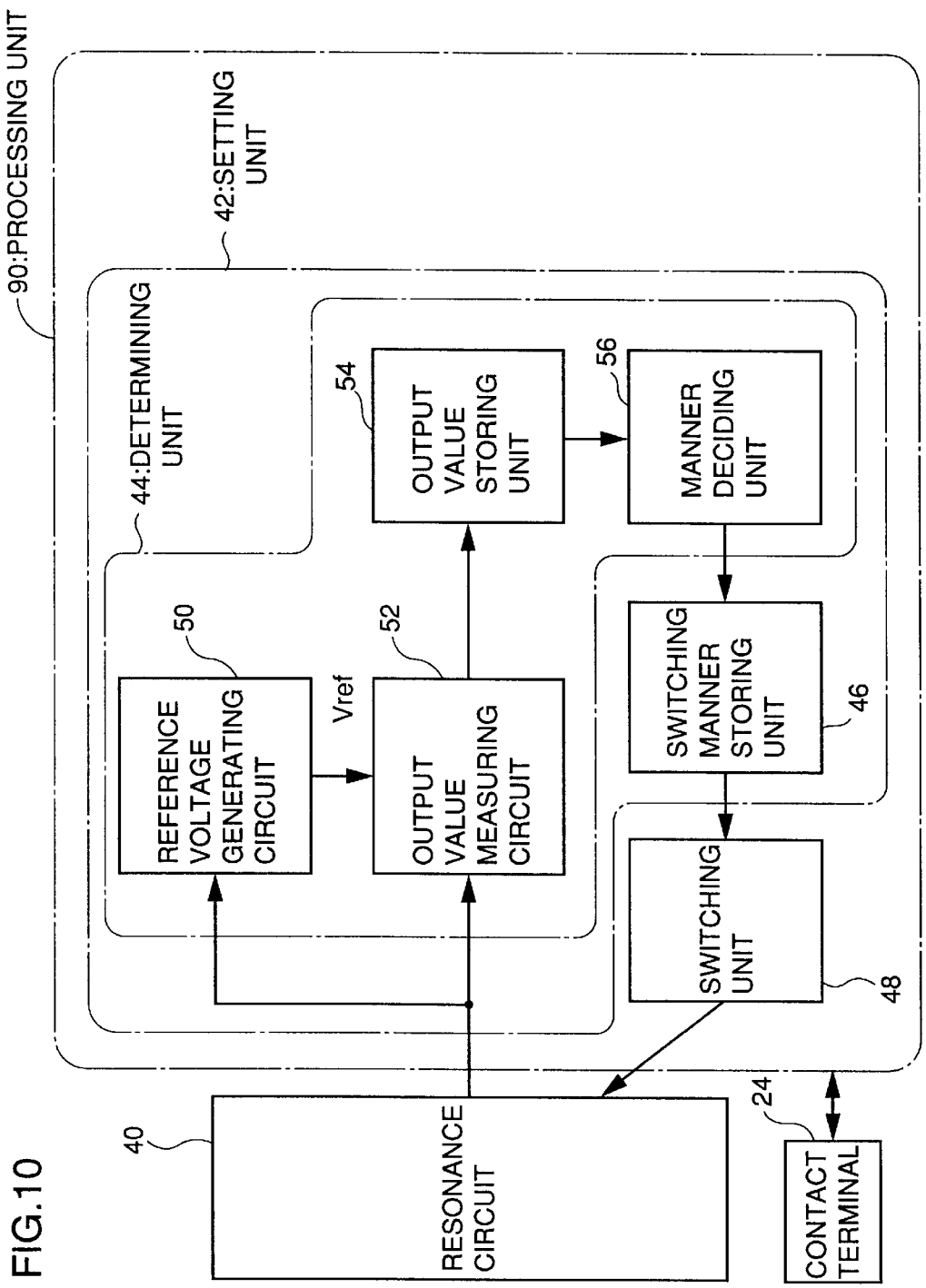
FIG. 10 is a block diagram illustrating a circuit for adjusting the resonance frequency in the IC chip.

FIG. 10 is a block diagram illustrating a structure of processing unit 90 in IC chip 82 having such an adjusting function. Resonance circuit 40 including antenna 60 is structured such that the resonance frequency thereof can be switched. Processing unit 90 includes a switching unit 48 sequentially switching the resonance frequency of resonance circuit 40, and a setting unit 42 setting a switching manner of switching unit 48 to allow the output from resonance circuit 40 to have a desired level. Setting unit 42 includes a determining unit 44 determining which of a plurality of switching manners is a favorable switching manner that causes an output from the resonance circuit 40 to have a desired level, and a switching manner storing unit 46 storing the favorable switching manner determined by determining unit 44. Determining unit 44 includes a reference voltage generating circuit 50, an output value measuring circuit 52, an output value storing unit 54, and a manner deciding unit 56.

Reference voltage generating circuit 50 receives an output from resonance circuit 40 and converting it to direct current voltage. Although switching of the resonance frequency causes change in the direct current voltage, reference voltage generating circuit 50 generates a constant reference voltage Vref regardless of the change.

Output value measuring circuit 52 measures an output value from resonance circuit 40 for each switching manner, that is, for each resonance frequency based on reference voltage Vref. The measured output value is associated with each switching manner and stored in output value storing unit 54. Output value storing unit 54 thus stores a plurality of switching manners and a plurality of output values corresponding thereto.

Manner deciding unit 56 selects the highest output value from the plurality of output values stored in output value storing unit 54, and decides that a corresponding switching manner is the favorable switching manner. The favorable switching manner for the resonance frequency which enables the most efficient power supply is accordingly obtained. This favorable switching manner is stored in switching manner storing unit 46.

After the resonance frequency is thus adjusted, switching unit 48 determines the resonance frequency of resonance circuit 40 according to the favorable switching manner stored in switching manner storing unit 46. In this embodiment, a nonvolatile memory capable of holding data without power supply is employed as switching manner storing unit 46. Therefore, adjustment of the resonance frequency for each use of IC card 80 is not required.

Figure 11:
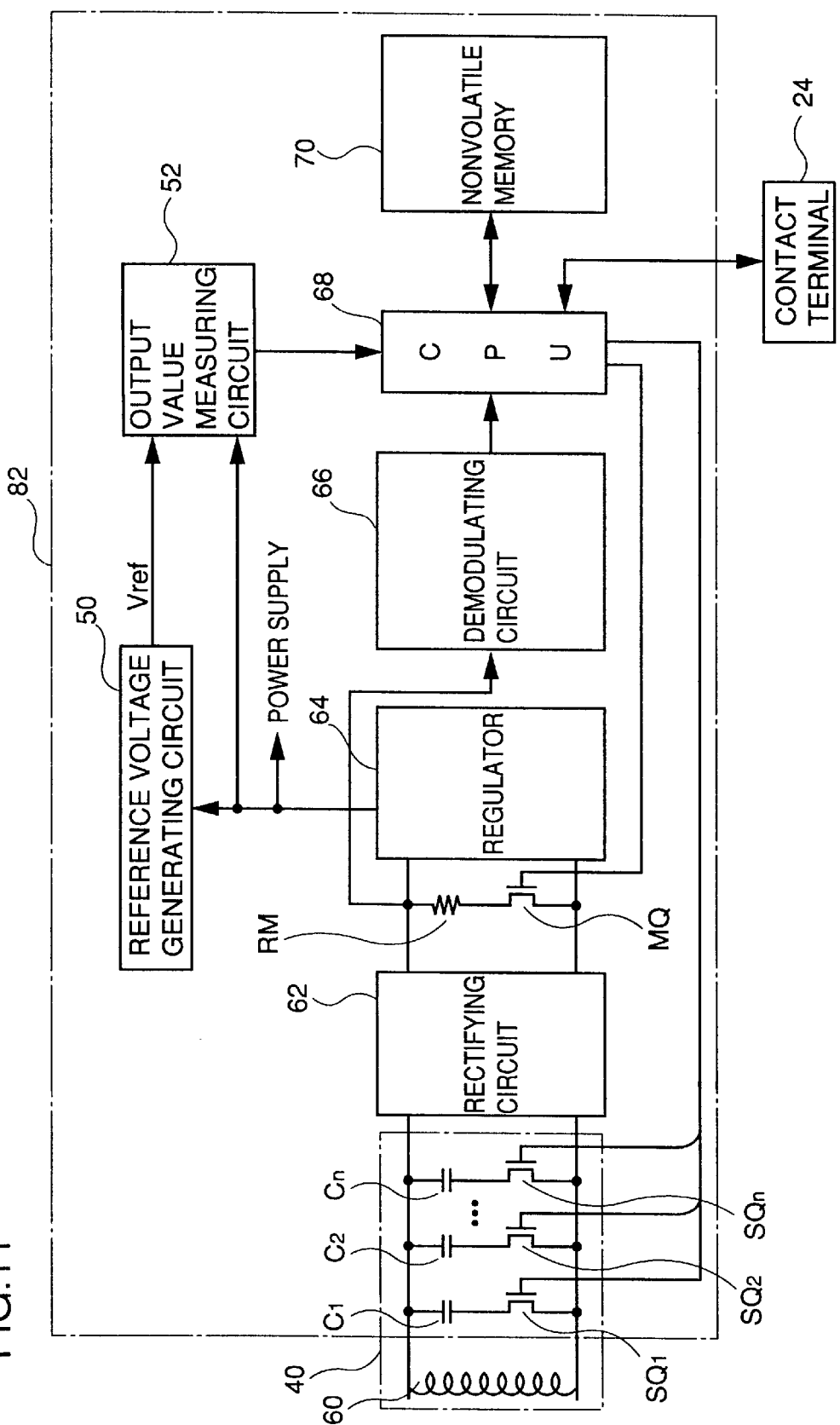
FIG. 11 is a block diagram illustrating a processing circuit in the IC chip.

FIG. 11 is a block diagram illustrating a circuit structure of IC card 80. In this embodiment, those components except for antenna 60 and contact terminal 24 form the processing circuit of IC chip 82.

IC card 80 functions as follows as a contact type IC card. Specifically, IC card 80 receives power from or communicates data with a contact type interrogator (not shown) via contact terminal 24. A CPU 68 provided to IC chip 82 decodes data to rewrite data in a nonvolatile memory 70 or to respond to the contact type interrogator.

On the other hand, IC card 80 functions as a non-contact type IC card as follows. A rectifying circuit 62 rectifies a high-frequency carrier wave supplied from a non-contact type interrogator (not shown) and supplies it to a regulator 64. Regulator 64 stabilizes it to generate electric power to be supplied to each component. A demodulating circuit 66 detects the modulated high-frequency carrier wave and demodulates it to reproduce data. The data is supplied to CPU 68 where a prescribed processing is performed.

If data is transmitted to the non-contact type interrogator, CPU 68 turns on or off a transistor for modulation MQ to switch connection of resistor RM while the non-contact type interrogator outputs a non-modulated high-frequency carrier wave. Accordingly, the impedance observed by the non-contact type interrogator is changed to change the amplitude of the carrier wave. The non-contact type interrogator can reproduce data by detecting the change in the amplitude. Such an operation program of CPU 68 is stored in nonvolatile memory 70.

Antenna 60, capacitors C1, C2, . . . , Cn, and transistors SQ1, SQ2, . . . , SQn constitute resonance circuit 40 in this embodiment. The electrostatic capacitance of capacitors C1, C2, . . . , Cn is set to gradually decrease in this order. The electrostatic capacitance of a capacitor Cm (m=n/2) is designed such that a resonance frequency fm of resonance circuit 40 formed of capacitor Cm accords with frequency of a carrier wave transmitted from the non-contact type interrogator. Electrostatic capacitance of other capacitors is set such that resonance frequencies of those capacitors are slightly different from each other with resonance frequency fm as a center. In this embodiment, the difference between resonance frequencies of capacitors adjacent to each other is made equal such that resonance frequency f1 of capacitor C1 is the minimum and resonance frequency fit of capacitor Cn is the maximum.

Figure 12:
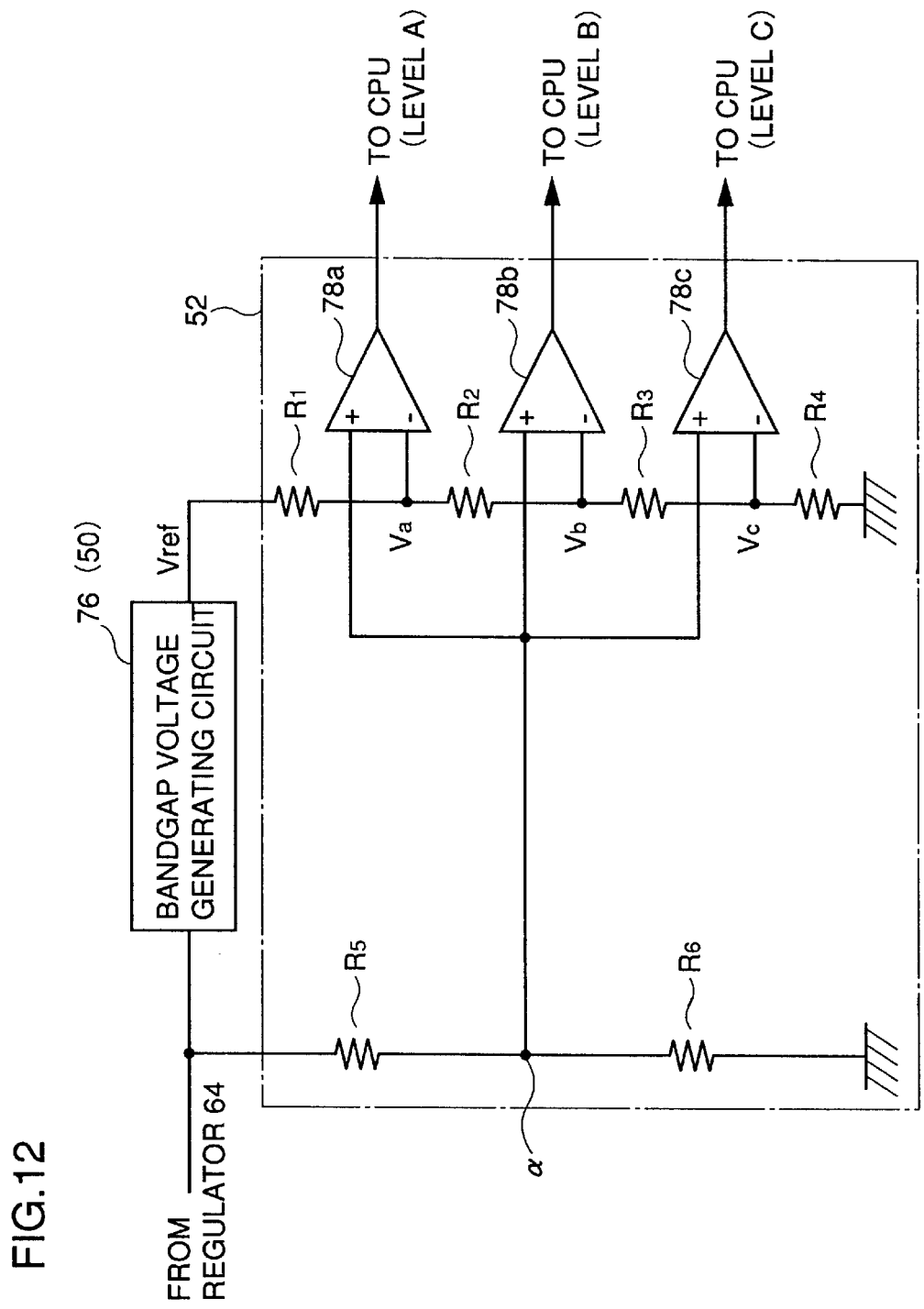
FIG. 12 is a block diagram illustrating structures of a reference voltage generating circuit and an output value measuring circuit shown in FIG. 11.

Output of regulator 64 is supplied to reference voltage generating circuit 50 and output value measuring circuit 52. Reference voltage generating circuit 50 and output value measuring circuit 52 are illustrated in FIG. 12 in detail. In this embodiment, a bandgap voltage generating circuit 76 is employed as reference voltage generating circuit 50. Bandgap voltage generating circuit 76 maintains the constant output voltage even if voltage supplied from regulator 64 changes. Therefore, the output voltage is used as reference voltage Vref.

Reference voltage Vref is divided by resistors R1–R4 to obtain threshold values Va, Vb and Vc. Comparators 78a, 78b and 78c compare divided-voltage values produced by dividing output voltage from regulator 64 by R5 and R6 with threshold values Va, Vb and Vc to obtain outputs of levels A, B and C. Specifically, if the intensity of the received carrier wave is high and an output from regulator 64 is higher than threshold value Va, all of comparators 78a, 78b and 78c supply outputs. If an output from regulator 64 is lower than threshold value Va and higher than threshold value Vb, comparators 78b and 78c supply outputs. If an output from regulator 64 is smaller than threshold value Vb and higher than threshold value Vc, only comparator 78c supplies an output. If an output from regulator 64 is smaller than threshold value Vc, no comparator supplies an output. Outputs from comparators 78a, 78b and 78c are supplied to CPU 68.

Figure 13:
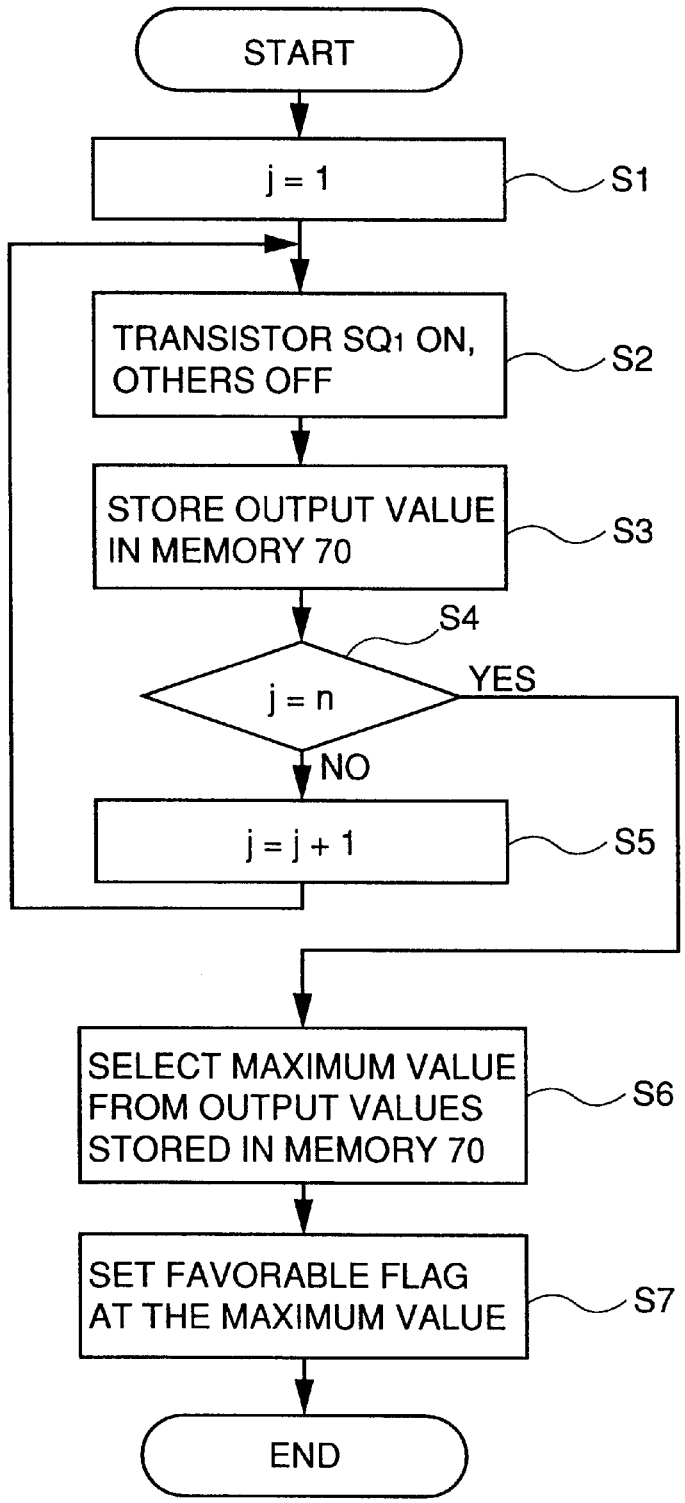
FIG. 13 is a flow chart illustrating an automatic adjust processing by a CPU shown in FIG. 11.

Referring again to FIG. 11, nonvolatile memory 70 stores, in addition to the program for contact type and non-contact type communications, a program for automatic adjustment of the resonance frequency. FIG. 13 shows a flow chart of the automatic adjustment program. A process for automatic adjustment of the resonance frequency is described below by reference to the flow chart of FIG. 13 and the block diagram of FIG. 11.

Figure 15:
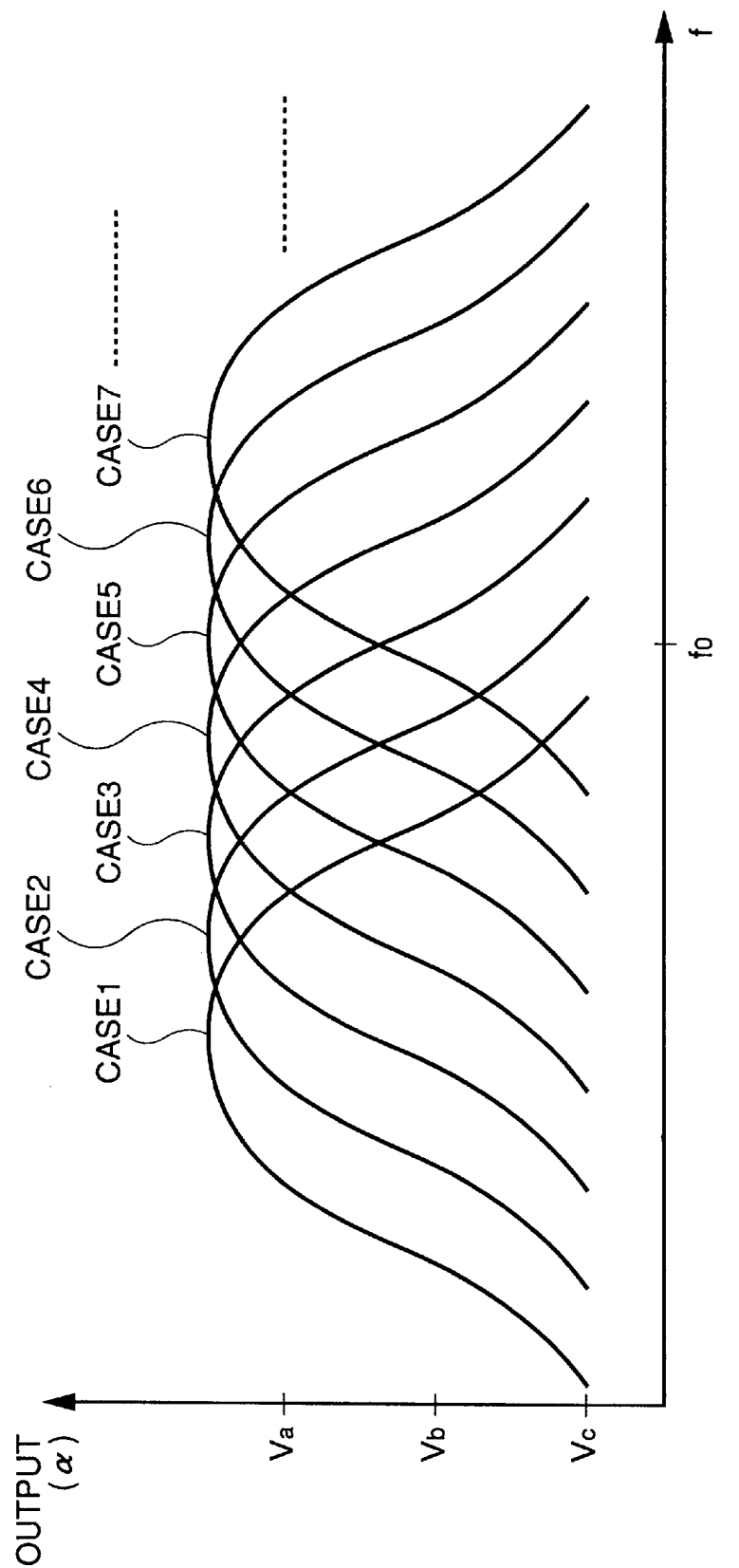
FIG. 15 illustrates a relation between frequency characteristics of the resonance circuit and carrier frequencies of a non-contact type interrogator in respective switching manners.

Entering the automatic adjustment mode, CPU 68 first sets a variable j representing a switching manner to 1 (step S1). CPU 68 next controls transistors such that a transistor SQj is turned on and other transistors are turned off (step S2). Since j is now equal to 1, only transistor SQ1 is turned on. Accordingly, capacitor C1 is connected and the resonance frequency is the minimum. The frequency characteristic of the resonance circuit in this case is shown by CASE1 in FIG. 15. In FIG. 15, the axis of ordinates indicates the voltage at a node a in FIG. 12. As shown in FIG. 15, if the frequency of the carrier wave of the non-contact type interrogator is f0, no output is obtained from comparators 78a, 78b and 78c for CASE1. CPU 68 associates output levels A, B and C of respective comparators 78a, 78b and 78c with switching manner j and stores them in nonvolatile memory 70 (step S3, see FIG. 16). In this case, A=0, B=0, and C=0 are stored. In this embodiment, the portion of nonvolatile memory 70 shown in FIG. 16 corresponds to output value storing unit 54 and switching manner storing unit 46 (see FIG. 10). Accordingly, switching manner storing unit 46 stores which of transistors SQ1–SQn are to be turned on.

In step S4, it is determined whether switching manner j attains the maximum value n. If not, switching manner j is incremented to j=2 (step S5). Returning to step S2, the process similar to the one described above is performed for the second switching manner. Specifically, transistor SQ2 is turned on and other transistors are turned off to connect capacitor C2. As a result, the frequency characteristic of the resonance circuit as represented by CASE2 of FIG. 15 is obtained. Therefore, only comparator 78c supplies an output relative to the high-frequency carrier wave of f0. CPU 68 receives the output and associates it with j=2 as shown in FIG. 16 and stores A=0, B=0 and C=1 in nonvolatile memory 70.

The process described above is repeated until switching manner j attains n, and after that, step S6 is carried out. After the process proceeds to a point at which j=n, nonvolatile memory 70 has stored output values for respective switching manners as shown in FIG. 16. In step S6, the maximum value is selected from the stored output values. In this case, the maximum output values correspond to switching manners j=4, 5 and 6. The central switching manner j=5 is selected among those as a favorable switching manner. It is clearly understood from FIG. 15 that switching manner j=5 is preferable. CPU 68 next sets a favorable flag relative to the favorable switching manner j=5 and stores it (step S7). In this embodiment, step S6 corresponds to manner deciding unit 56 (see FIG. 10).

Figure 14:
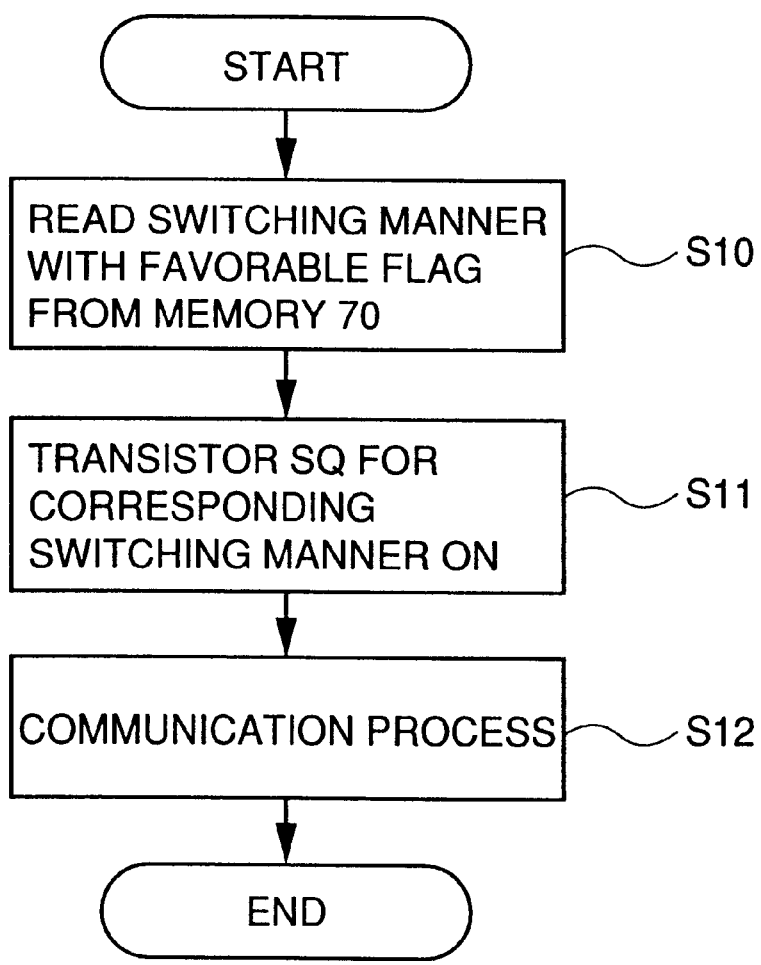
FIG. 14 is a flow chart illustrating an operation processing by a favorable resonance frequency determined by the automatic adjust processing shown in FIG. 13.

After the favorable switching manner is thus decided, CPU 68 operates according to the favorable resonance frequency. The flow chart of this process is shown in FIG. 14. In step S10, switching manner j with the stored favorable flag is first obtained from nonvolatile memory 70. Next transistor SQj designated by switching manner j is turned on (step S11). Power supply by the high-frequency carrier wave from the non-contact type interrogator is thus possible in the most efficient state. After this, a predetermined communication process is carried out (step S12). In this embodiment, steps S10 and S11 correspond to switching unit 48 (see FIG. 10).

IC card 80 can automatically adjust the resonance frequency of resonance circuit 40 to allow the power supply from the non-contact type interrogator to be maximum. Therefore, change in the resonance frequency of resonance circuit 40 due to the difference in material, shape, size of contact terminal 24 placed in the vicinity of antenna 60 as well as the positional relation and distance between contact terminal 24 and antenna 60, and difference in the resonance frequency of resonance circuit 40 due to the difference in the number of components can be adjusted easily in the manufacturing stage. Further, since switching manner storing unit 46 stores the favorable switching manner, just one adjustment provides the favorable resonance frequency by the operation illustrated in FIG. 14 in the actual use, and therefore, the operating speed does not deteriorate.

Further, regulator 64 generates electric power based on electromagnetic waves supplied from the interrogator to antenna 60, and reference voltage generating circuit 50 generates the constant reference voltage Vref regardless of the change in the electric power, so that IC card 80 can correctly adjust the resonance frequency without internal power supply.

According to the embodiment above, all switching manners are examined in order to obtain the favorable switching manner. However, it may be possible to measure the output value of resonance circuit 40 by output value measuring circuit 52 each time switching unit 48 switches the switching manner, stops examination of the switching manner when an output value exceeding a prescribed threshold value is obtained, and determine the switching manner corresponding thereto as a favorable switching manner. Accordingly, the automatic adjustment of the resonance frequency can be done speedily.

Alternatively it may be possible to stop examination of the switching manner when the output value exceeds the prescribed threshold value and the output value thereafter becomes smaller than that for the preceding switching manner, and determine a switching manner corresponding to the previously obtained maximum output value as a favorable switching manner. The optimum switching manner can thus be obtained speedily.

Figure 17:
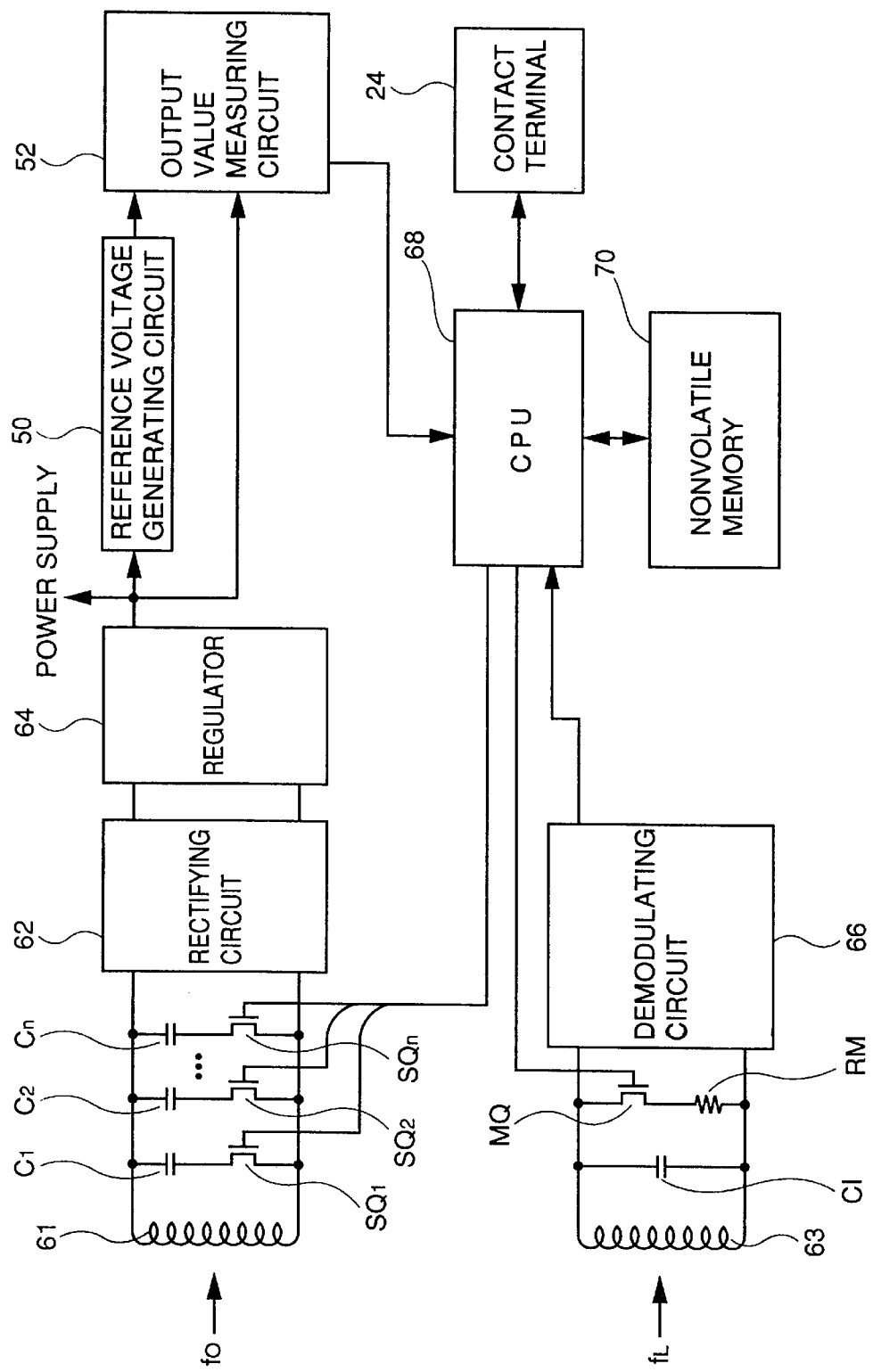
FIGS. 17 and 18 are block diagrams respectively illustrating other examples of the processing circuit in the IC chip.

In the embodiment described above, although IC card (one coil type) 80 employing the same carrier wave for power supply and information communication in the non-contact type communication is described, the present invention is applicable to an IC card (two-coil type) using carrier waves of different frequencies for power supply and information communication in the non-contact type communication. A structure of such an embodiment is illustrated in FIG. 17. Power supply from a non-contact type interrogator is received with a non-modulated carrier wave f0, and a carrier wave fL is used for communicating information with the interrogator.

A resonance circuit for information communication is formed of an antenna 63 and a capacitor CI. A demodulating circuit 66 demodulates data from a modulated carrier wave and supplies it to a CPU 68. If data is to be transmitted to a non-contact type interrogator, CPU 68 turns on/off a transistor for modulation MQ to switch connection of a resistor RM while the non-contact type interrogator outputs non-modulated carrier wave fL. Accordingly, the impedance observed by the non-contact type interrogator is changed to change the amplitude of carrier wave fL, so that data can be reproduced at the non-contact type interrogator.

A resonance circuit for receiving power supply is formed of an antenna 61, capacitors C1–Cn, and transistors SQ1–SQn. CPU 68 determines a favorable switching manner of transistors SQ1–SQn based on an output of a regulator 64 and stores it in a nonvolatile memory 70 in a manner similar to the embodiment described above.

Figure 18:
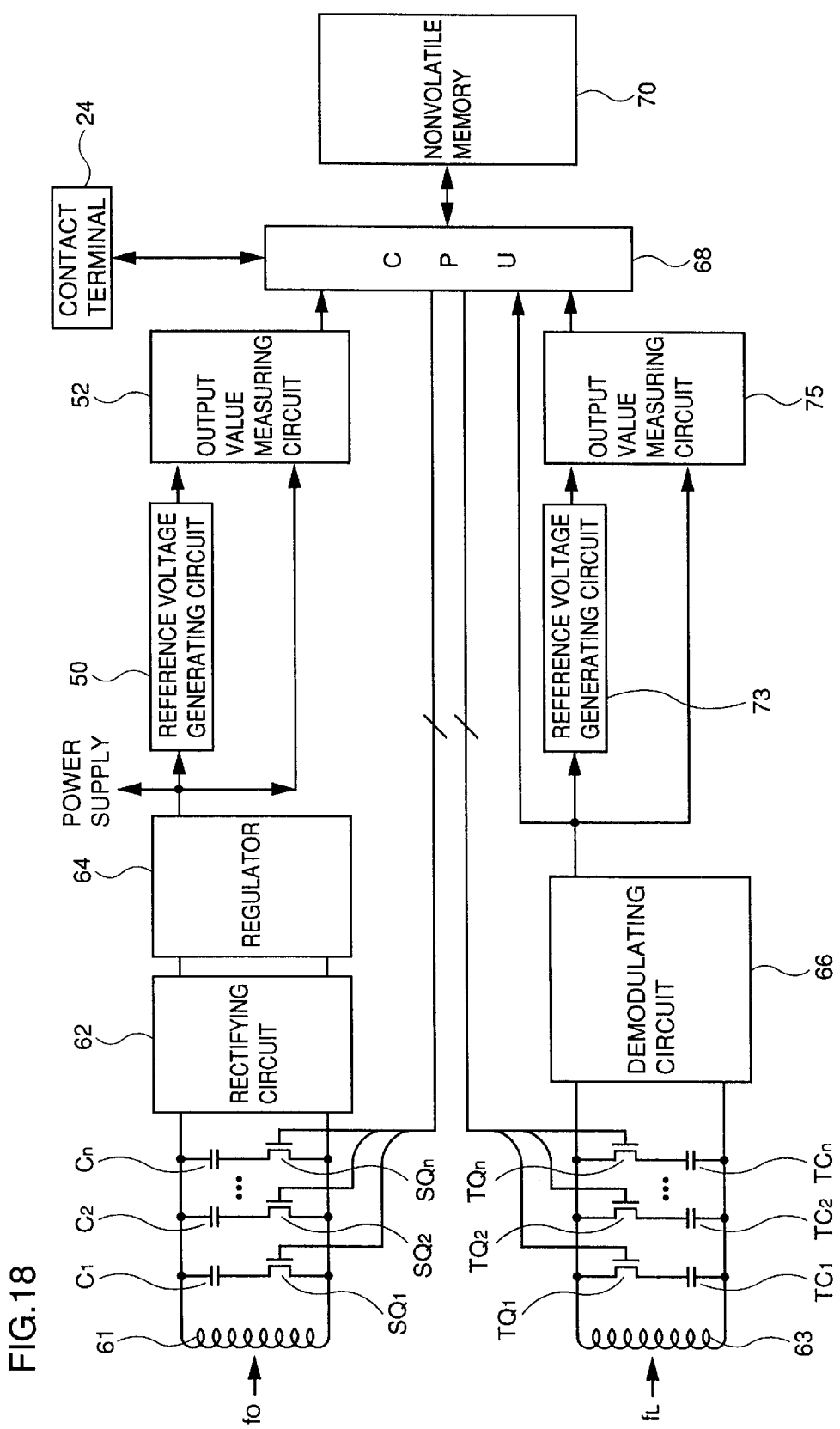
Figure 20:
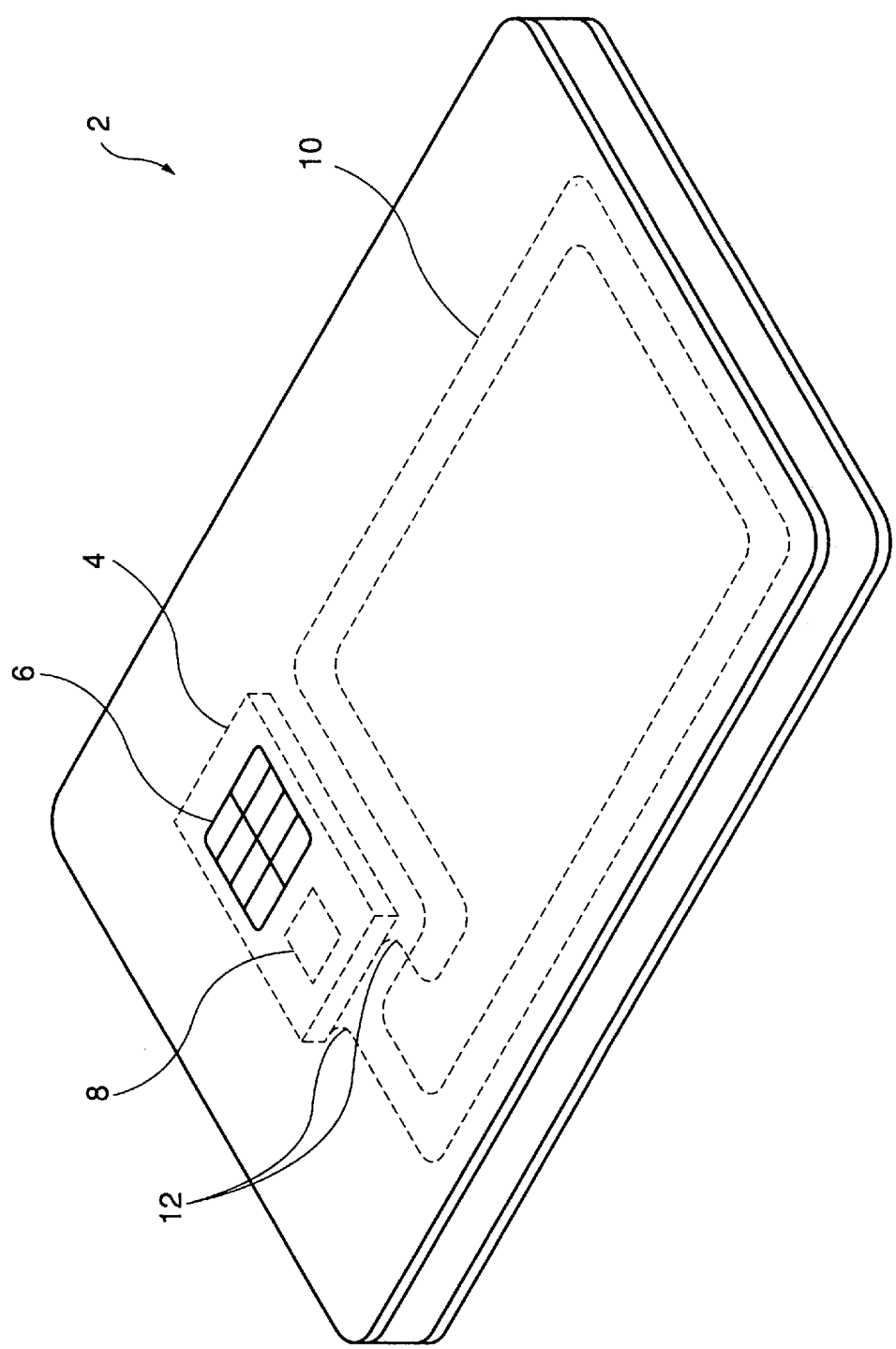
FIG. 20 is a perspective view illustrating an example of a conventional IC card (one coil type) used for both of the contact and non-contact applications.

FIG. 18 illustrates still another embodiment. In this embodiment, the resonance frequency is automatically adjusted in not only the resonance circuit for power supply but the resonance circuit for information communication. Therefore, capacitors TC1–TCn are structured to be switched by transistors TQ1–TQn in the resonance circuit for information communication. Further, a favorable switching manner is determined by comparing an output of a demodulating circuit 66 with the reference voltage. It is noted that a structure of a reference voltage generating circuit 73 is similar to that of reference voltage generating circuit 50, and a structure of an output value measuring circuit 75 is similar to that of output value measuring circuit 52.

According to this embodiment, the resonance frequency for information communication can automatically be adjusted. Further, a modulating circuit (corresponding to transistor MQ and resistor RM in FIG. 17) for transmitting information to a non-contact type interrogator is not specially provided. The reason is that the control by CPU 68 allows the favorable switching manner and other switching manners to be switched depending on data in order to change the impedance observed by the non-contact type interrogator.

In respective embodiments described above, one of capacitors C1–Cn (TC1–TCn) is connected to antenna 60

(61, 63). However, a switching manner in which a plurality of capacitors are simultaneously connected to the antenna may be provided. A number of switching manners can thus be obtained with a small number of capacitors.

Figure 19:
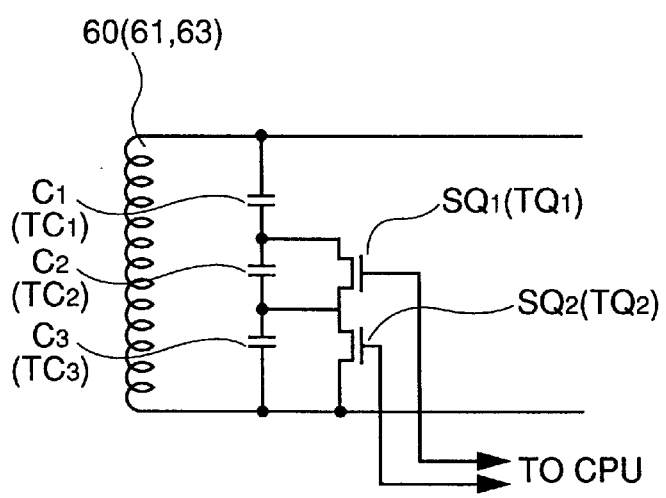
FIG. 19 is a circuit diagram illustrating another example of the resonance circuit.

FIG. 19 illustrates another structure of the resonance circuit. In this resonance circuit, capacitors C1, C2 and C3 connected in series are switched. The structure of the resonance circuit may be determined considering the number of points for connection depending on to what extent the IC is formed as a chip.

According to respective embodiments described above, the resonance frequency is automatically adjusted when the communication module or the IC card is manufactured. However, the automatic adjustment may be made at a prescribed interval in order to correct the change in the resonance frequency due to wearing, deterioration with age of contact terminal 24, change of ambient temperature or the like. For example, automatic adjustment may be made on a prescribed date, or after a prescribed period has passed since the last adjustment, or every prescribed number of use. In order to make automatic adjustment on the prescribed date, a clock may be provided to determine the favorable switching manner again when the date of the clock agrees with the prescribed date. In order to make automatic adjustment after the prescribed period has passed since the last adjustment, a timer which is reset and starts operating upon the adjustment may be provided to determine the favorable switching manner again when the time of the timer agrees with a prescribed time. In order to make automatic adjustment every prescribed number of use, a counter may be provided which is incremented each time the IC card communicates with the interrogator, and the favorable switching manner may be determined again when the value of the counter agrees with a prescribed value. In those cases, the date, the time passed, and the number of times of use may be measured by the contact or non-contact type interrogator, or by the IC card. Alternatively, they may cooperate for the measurement.

Further, if the processing speed is sufficient, automatic adjustment may be made each time the card is used as the non-contact type IC card.

In respective embodiments described above, the carrier wave is applied to pulse-amplitude modulation for non-contact type information communication. However, the invention is applicable to pulse-frequency modulation, pulse-phase modulation, analog amplitude modulation, analog frequency modulation, analog phase modulation and the like.

Although the description is made by applying the present invention to the one-coil type or two-coil type IC card used for both of the contact and non-contact type applications in respective embodiments described above, the invention is applicable to an IC card for both of the contact and non-contact type applications having at least three coils. The invention is generally applicable to not only the IC card but responsers for both of the contact and non-contact type applications belonging to various types such as box-type, notebook-type and the like regardless of the shape.

Although data is communicated between the interrogator and the IC card as radio communication utilizing the electromagnetic function in respective embodiments described above, the communication may use not only radio waves but electromagnetic coupling. Further, although the transistors are employed for allowing the resonance frequency of the resonance circuit to be switched in the embodiments above, other switching elements capable of switching the state of connection, constant and the like of the circuit may alternatively be employed. Therefore, not only an electrical switching element such as the transistor but a mechanical switching element may be used. Further, not only a switching element which is digitally turned on or off but a switching element which successively changes the constant such as the resistant value in an analog manner may be used. As the antenna, an element having an inductance component necessary for receiving a desired electromagnetic wave may be employed without limited by the outward shape, the method of formation and the like of the antenna. As the capacitor, any element having an electrostatic capacitance necessary for constituting the resonance circuit together with the antenna may be used without limitation of the outward shape, the method of formation and the like. Accordingly, a stray capacitance of the antenna may be used as the capacitor.

The embodiments disclosed should be considered to be given by way of illustration and example only and is not to be taken by way of limitation. It is intended that the scope of the invention is illustrated not by the description above but by the claims, and all changes equivalent to the meaning of and within the scope of claims are included.

What is claimed is:

1. A responser having a communication module and communicating with an interrogator, said communication module including:
    a circuit board;
    a contact terminal provided at said circuit board for electrical contact with said interrogator, wherein said contact terminal is provided at one surface of said circuit board;
    an antenna provided at an other surface of said circuit board and formed to allow change in resonance frequency due to an influence of said contact terminal to be corrected for receiving electromagnetic waves from said interrogator; and
    a processing circuit provided at the other side of said circuit board and connected to said contact terminal and said antenna to process a signal supplied from said interrogator via said contact terminal or said antenna and a signal to be supplied to said interrogator via said contact terminal or said antenna.

2. The responser according to claim 1, wherein said antenna is directly formed on said circuit board.

3. The responser according to claim 1, wherein said processing circuit includes a capacitor coupled with said antenna to form a resonance circuit.

4. The responser according to claim 1, wherein said communication module further includes a capacitor formed on said circuit board and coupled with said antenna to form a resonance circuit.

5. The responser according to claim 1, wherein said antenna is formed integrally with said processing circuit.

6. The responser according to claim 1, wherein said processing circuit includes:
    switching means for switching a resonance frequency of said antenna; and
    setting means for setting a switching manner of said switching means to cause an output from said antenna which changes depending on reactance between said contact terminal and said antenna to have a desired level.

7. The responser according to claim 6, wherein said setting means includes:
    determining means for determining which of switching manners of said switching means is a favorable switching manner that causes the output from said antenna to have the desired level; and
    switching manner storing means for storing the favorable switching manner determined by said determining means.

8. The responser according to claim 7, wherein
said processing circuit further includes power generating means for generating electric power based on the electromagnetic waves supplied from said interrogator to said antenna, and
said determining means includes:
reference voltage generating means for generating a constant reference voltage regardless of change in electric power from said power generating means;
output value measuring means for measuring an output value from said antenna in each switching manner based on the reference voltage from said reference voltage generating means; and
manner deciding means for deciding on said favorable switching manner based on an output value from said output value measuring means.

9. The responser according to claim 8, wherein
said determining means further includes output value storing means for associating the output value from said output value measuring means with each switching manner and storing the output value, and
said switching manner deciding means decides on said favorable switching manner based on the output value stored in said output value storing means.

10. The responser according to claim 7, wherein
said determining means determines that a switching manner which causes the output from said antenna to have a maximum level is said favorable switching manner.

11. The responser according to claim 7, wherein
said determining means measures the output value from said antenna each time the switching manner is sequentially switched and determined, when the output value exceeds a prescribed value, the switching manner which causes the output value as said favorable switching manner.

12. The responser according to claim 7, wherein
said processing circuit includes:
a plurality of capacitors; and
a plurality of transistors selectively coupling said capacitors with said antenna to form a resonance circuit, and
said switching manner storing means stores which of said transistors should be turned on.

13. The responser according to claim 7, wherein
said determining means determines said favorable switching manner when said responser is manufactured.

14. The responser according to claim 7, wherein
said determining means determines said favorable switching manner on prescribed date and time.

15. The responser according to claim 7, wherein
said determining means determines said favorable switching manner each time a prescribed period has passed since said favorable switching manner was determined.

16. The responser according to claim 7, wherein
said determining means determines said favorable manner each time said responser is used a prescribed number of times.

17. The responser according to claim 6, wherein
said switching mean switches said resonance frequency by switching an electrostatic capacitance coupled with said antenna.

18. The responser according to claim 6, wherein
said antenna is used for supplying electric power to said processing circuit.

19. The responser according to claim 6, wherein
said antenna is used for communication with said interrogator.

20. The responser according to claim 1, wherein
said communication module further includes a
printed interconnection line formed on said circuit board, and
a terminal of said processing circuit is connected to said printed interconnection line by a bumping technique.

21. The responser according to claim 1, wherein
said communication module further includes a
printed interconnection line formed on said circuit board, and
a terminal of said processing circuit is connected to said printed interconnection line via an anisotropic conductor.

22. A communication module used for a responser communicating with an interrogator, comprising:
a circuit board;
a contact terminal provided at one surface of said circuit board for electrically contacting with said interrogator;
an antenna directly provided at an other surface of said circuit board and formed to allow change in resonance frequency due to an influence of said contact terminal to be corrected for receiving electromagnetic waves from said interrogator; and
a processing circuit provided at said circuit board and connected to said contact terminal and said antenna to process a signal supplied from said interrogator via said contact terminal or said antenna and a signal to be supplied to said interrogator via said contact terminal or said antenna.

23. The communication module according to claim 22, wherein said processing circuit includes:
switching means for switching a resonance frequency of said antenna; and
setting means for setting a switching manner of said switching means to cause an output from said antenna which changes depending on reactance between said contact terminal and said antenna to have a desired level.

24. An IC card comprising:
a container having an opening; and
a communication module embedded in said container, said communication models including:
a circuit board;
a contact terminal formed on one surface of said circuit board and exposed from the opening of said container;
an antenna formed on an other surface of said circuit board to allow change, in resonance frequency due to an influence of said contact terminal to be corrected; and
an IC chip mounted on said circuit board and connected to said contact terminal and said antenna.

25. The IC card according to claim 24, wherein
said IC chip includes:
switching means for switching a resonance frequency of said antenna; and
setting means for setting a switching manner of said switching means to cause an output from said antenna which changes depending on reactance between said contact terminal and said antenna to have a desired level.

* * * * *